United States Patent [19]

Ukita et al.

[11] Patent Number: 5,764,672
[45] Date of Patent: *Jun. 9, 1998

[54] SEMICONDUCTOR LASER

[75] Inventors: Masakazu Ukita; Akira Ishibashi, both of Kanagawa, Japan

[73] Assignee: Sony Corporation, Tokyo, Japan

[*] Notice: The term of this patent shall not extend beyond the expiration date of Pat. No. 5,625,634.

[21] Appl. No.: 829,064

[22] Filed: Mar. 31, 1997

Related U.S. Application Data

[63] Continuation of Ser. No. 275,374, Jul. 15, 1994, Pat. No. 5,625,634.

[30] Foreign Application Priority Data

Jul. 28, 1993 [JP] Japan .................................. 5-205919

[51] Int. Cl.$^6$ ........................................................ H01S 3/19
[52] U.S. Cl. .................................................. 372/45; 372/43
[58] Field of Search .................................................. 372/45, 43

[56] References Cited

U.S. PATENT DOCUMENTS

| | | | |
|---|---|---|---|
| 4,691,321 | 9/1987 | Motegi et al. | 372/46 |
| 5,363,395 | 11/1994 | Gaines et al. | 372/45 |
| 5,389,800 | 2/1995 | Itaya et al. | 257/94 |

OTHER PUBLICATIONS

Electronics Letters, Aug. 5, 1993, vol. 29, No. 16, "Room Temperature Continuous Operation of Blue–Green Laser Diodes", Nakayama et al.

IEEE Transactions on Electron Devices, vol. 40, No. 11, Nov. 1993, "Blue–Green Buried–Ridge Laser Diodes", M.A. Haase et al.

*Primary Examiner*—Rodney B. Bovernick
*Assistant Examiner*—Yisun Song
*Attorney, Agent, or Firm*—Hill & Simpson

[57] ABSTRACT

A semiconductor laser comprises: a first cladding layer of a first conduction type; an active layer stacked on the first cladding layer; and a second cladding layer of a second conduction type stacked on the active layer. The first cladding layer, the active layer and the second cladding layer are made of II-VI compound semiconductors. Pulse oscillation occurs with characteristics of a threshold current $I_{th}(A)$, a threshold voltage $V_{th}(V)$ of the diode composed of the first cladding layer, the active layer and the second cladding layer, a differential resistance $R_S(\Omega)$ of the diode after the rising, a thermal resistance $R_t(K/W)$ and a characteristic temperature $T_0(K)$. When two amounts $\alpha$ and $\beta$ are defined by:

$$\alpha \equiv (R_t/T_0) I_{th} V_{th}$$

$$\beta \equiv (R_t/T_0) R_S I_{th}^2$$

the point ($\alpha$, $\beta$) exists in an area on the $\alpha$-$\beta$ plane surrounded by the straight line $\alpha=0$, the straight line $\beta=0$, and the curve $((2\ln t-1)/t, (1-\ln t)/t^2)$ having t as a parameter. The semiconductor laser may include a first optical waveguide layer between the first cladding layer and the active layer and include a second optical waveguide layer between the second cladding layer and the active layer, the first optical waveguide layer and the second optical waveguide layer being made of II-VI compound semiconductors. II-VI compound semiconductors making the first cladding layer and the second cladding layer may be a ZnMgSSe compound semiconductor. A semiconductor laser using II-VI compound semiconductors and having the capability of continuous oscillation at high temperatures including the room temperature is provided.

3 Claims, 8 Drawing Sheets

SEMICONDUCTOR LASER

This is a continuation of application Ser. No. 08/275,374, filed Jul. 15, 1994 now U.S. Pat. No. 5,625,634.

BACKGROUND OF THE INVENTION

This invention relates to a semiconductor laser capable of emitting, for example, blue to green light.

In recent years, there is a demand for semiconductor lasers capable of emitting light with short wavelengths for improving recording densities of optical disks or resolutions of laser printers, and vigorous studies have been made for realization of such lasers.

II-VI compound semiconductors are hopeful as materials to be used for fabricating such semiconductor lasers capable of emitting light with short wavelengths. In particular, ZnMgSSe compound semiconductors, which are quaternary II-VI compound semiconductors, are recognized to be suitable as materials of cladding layers and optical waveguide layers required to make on a GaAs substrate a semiconductor laser for emitting blue to green light in the band of wavelengths of 400 nm–500 nm (see, for example, Electron. Lett. 28 (1992) 1798).

As to semiconductor lasers using II-VI compound semiconductors, active studies have been made to realize oscillation at the room temperature. As a result, the present Applicant has succeeded in pulse oscillation at the room temperature by a semiconductor laser using ZnMgSSe compound semiconductors referred to above.

As to continuous oscillation at the room temperature, however, there has been no report either with a semiconductor laser using ZnMgSSe compound semiconductors mentioned above or with a semiconductor laser using II-VI compound semiconductors other than ZnMgSSe compound semiconductors.

OBJECTS AND SUMMARY OF THE INVENTION

It is therefore an object of the invention to provide a semiconductor laser using a II-VI compound semiconductor as the material of cladding layers and having the capability of continuous oscillation at high temperatures including the room temperature.

According to an aspect of the invention, there is provided a semiconductor laser comprising: a first cladding layer of a first conduction type; an active layer stacked on the first cladding layer; and a second cladding layer of a second conduction type stacked on the active layer, wherein:

the first cladding layer, the active layer and the second cladding layer are made of II-VI compound semiconductors, and pulse oscillation occurs with characteristics of a threshold current $I_{th}(A)$, a threshold voltage $V_{th}(V)$ of the diode composed of the first cladding layer, the active layer and the second cladding layer, a differential resistance $R_s(\Omega)$ of the diode after the rising, a thermal resistance $R_t(K/W)$ and a characteristic temperature $T_0(K)$, and wherein:

when two amounts $\alpha$ and $\beta$ are defined by:

$$\alpha \equiv (R_t/T_0)I_{th}V_{th}$$

$$\beta \equiv (R_t/T_0)R_sI_{th}^2$$

the point $(\alpha, \beta)$ exists in an area on the $\alpha$-$\beta$ plane surrounded by the straight line $\alpha=0$, the straight line $\beta=0$, and the curve $((2\ln t-1)/t, (1-\ln t)/t^2)$ having t as a parameter.

According to another aspect of the invention, the semiconductor laser includes a first optical waveguide layer between the first cladding layer and the active layer and includes a second optical waveguide layer between the second cladding layer and the active layer, the first optical waveguide layer and the second optical waveguide layer being made of II-IV compound semiconductors.

According to still another aspect of the invention, II-VI compound semiconductors making the first cladding layer and the second cladding layer are a ZnMgSSe compound semiconductor.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
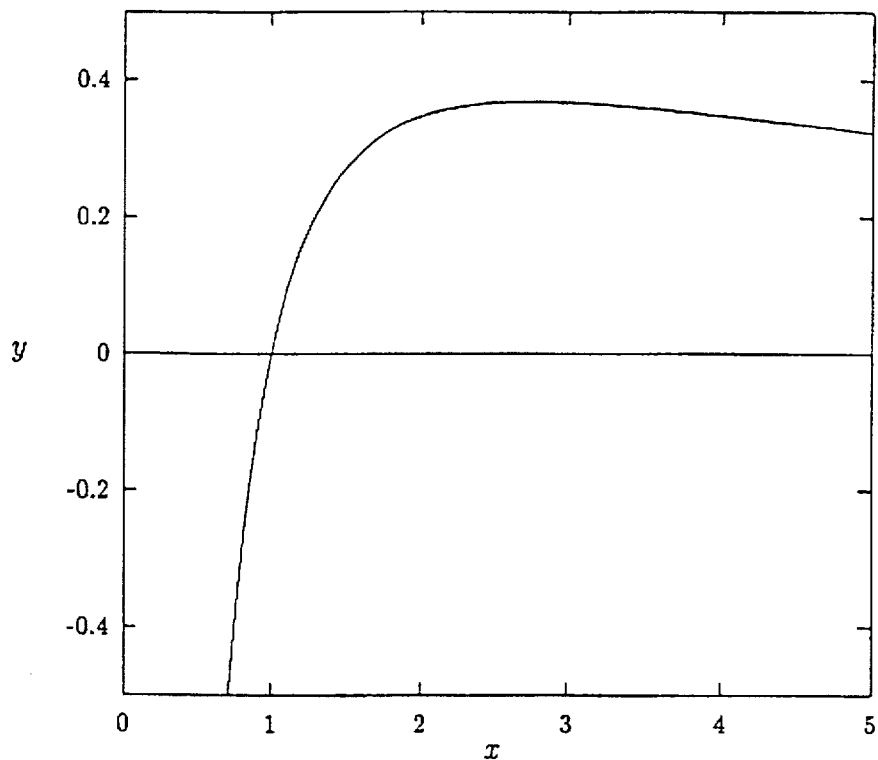
FIG. 1 is a graph for explaining the principle of the invention.

Assume that a semiconductor laser is driven with a duty k, the corresponding threshold current is $I_{th}(A)$, and the corresponding operating voltage is $V_{op}(V)$. $I_{th}$ and $V_{op}$ become functions of k, and k=1 corresponds to continuous driving of the semiconductor laser.

In this case, if the semiconductor laser is operated just above the threshold value for oscillation, the time average P(W) of power supplied to the semiconductor laser becomes:

$$P = kI_{th}V_{op} \tag{1}$$

Part of P is emitted as light to the exterior of the semiconductor laser, and the remainder appears as heat of the semiconductor laser.

Since an increase in temperature ΔT(K) of the semiconductor layer caused by the generation of heat is considered to be proportional with P, $$\Delta T = R_t P = k R_t I_{th} V_{op} \tag{2}$$

where $R_t$(K/W) is an (apparent) thermal resistance of the semiconductor. In this case, if the atmospheric temperature is $T_{atom}$(K), then the temperature T(K) of the semiconductor laser is:

$$T = T_{atom} + \Delta T \tag{3}$$

On the other hand, when the characteristic temperature is $T_0$(K), the temperature T and the threshold current $I_{th}$ of the semiconductor laser have the relation:

$$I_{th}(T=T_2) = I_{th}(T=T_1) \exp((T_2-T_1)/T_0) \tag{4}$$

Therefore, when the temperatures of the semiconductor laser operated with duties $k_1$ and $k_2$ are $T_1$ and $T_2$, respectively, and corresponding threshold currents are $I_{th}(T=T_1)=I_{th}(k_1)$ and $I_{th}(T=T_2)=I_{th}(k_2)$, then equations (2), (3) and (4) result in:

$$\begin{aligned}I_{th}(k_2) &= I_{th}(k_1)\exp((\Delta T(k_2)-\Delta T(k_1))/T_0) \\ &= I_{th}(k_1)\exp((R_t/T_0)[k_2 I_{th}(k_2)V_{op}(k_2) \\ &\quad -k_1 I_{th}(k_1)V_o(k_1)])\end{aligned} \tag{5}$$

Assuming that the current-voltage (I-V) characteristics of the semiconductor laser do not depend on the temperature and are expressed in the the form of the function:

$$V = V_{th} + R_s I \tag{6}$$

then, $V_{op} = V_{th} + R_s I_{th}$. Entering this equation into equation (5) results in:

$$I_{th}(k_2) = I_{th}(k_1) \exp((R_t/T_0)\{k_2 I_{th}(k_2)[V_{th}+R_s I_{th}(k_2)]-k_1 I_{th}(k_1)[V_{th}+R_s I_{th}(k_1)]\}) \tag{7}$$

In equation (7), if $k_1 \ll k_2 = 1$, $I_{th}(\text{pulse}) \equiv I_{th}(k_1)$, $I_{th}(\text{cw}) \equiv I_{th}$ (1), it becomes:

$$I_{th}(cw) = I_{th}(\text{pulse}) \exp (R_t/T_0)\{I_{th}(cw)[V_{th}+R_s I_{th}(cw)]\}) \tag{8}$$

By using the following three dimensionless quantities:

$$x \equiv I_{th}(cw)/I_{th}(\text{pulse}) \tag{9}$$

$$\alpha \equiv (R_t/T_0) I_{th}(\text{pulse}) V_{th} \tag{10}$$

$$\beta \equiv (R_t/T_0) R_s I_{th}^2(\text{pulse}) \tag{11}$$

equation (8) can be rewritten as:

$$x = \exp(\alpha x + \beta x^2) \tag{12}$$

Considering the physical meaning of equation (12), it is known that, when the parameter α indicative of an increase in threshold current due to the threshold voltage $V_{th}$ and the parameter β indicative of an increase in threshold current due to the serial resistance component $R_S$ are given, if x satisfying equation (12) exists, continuous oscillation is possible with a current x times the threshold current for pulse oscillation in a range in which generation of heat can be disregarded.

By taking logarithms of both sides of equation (12) and by dividing them by x, $$\ln x/x = \alpha + \beta x \tag{13}$$

is obtained. Therefore, the foregoing conditions can be reworded such that, if there exists a point of intersection of the curve:

$$y = \ln x/x \tag{14}$$

and the straight line:

$$y = \alpha + \beta x \tag{15}$$

then continuous oscillation at the room temperature is possible with the (minimum) value of the x-coordinates.

FIG. 1 shows a graph of y=ln x/x. Since α>0 and β>0, it is directly known that:

1. Unless $\alpha < e^{-1}$ and $\beta < e^{-1}/2$, no point of intersection exists. That is, continuous oscillation is not realized.

2. If a point of intersection exists, then the minimum x is smaller than e. That is, if continuous oscillation is realized, then the threshold current becomes less than e times the value upon pulse oscillation.

It should be noted that 1. is a necessary condition and not a sufficient condition.

$\beta < e^{-1}/2$ is obtained as follows. When α=0, conditions for y=ln x/x to intersect with $y = \beta_{MAX} x$ are given by simultaneous equations:

$$y(x_0) = \ln x_0/x_0 = \beta_{MAX} x_0 \tag{16a}$$

$$(dy/dx)(x_0) = (1-\ln x_0)/x_0^2 = \beta_{MAX} \tag{16b}$$

where $x_0$ is the x-coordinate of the point of intersection. To solve the simultaneous equations, $\beta_{MAX}$ is first canceled to obtain $x_0 = e^{1/2}$, which in turn is substituted in one of simultaneous equations to determine $\beta_{MAX} = e^{-1}/2$. It is apparent from FIG. 1 that $\beta < \beta_{MAX}$ is a necessary condition for existence of a point of intersection.

Necessary and sufficient conditions of α and β to make the curve of equation (14) and the straight line of equation (15) to have a point of intersection will now be obtained. Consideration is made by fixing α at a value in the range of (0, $e^{-1}$). When the slope of a tangent y=ln x/x with the y-intercept being a is indicated by $\beta_M(\alpha)$, it is known from FIG. 1 that $$\beta < \beta_M(\alpha) \tag{17}$$

is the condition wanted. When the coordinates of the point of contact of the tangent is ($x_0$, ln $x_0/x_0$), the equation of the tangent becomes:

$$\begin{aligned}y &= [(1-\ln x_0)/x_0^2](x-x_0) + \ln x_0/x_0 \\ &= [(1-\ln x_0)/x_0^2]x + (2\ln x_0 - 1)/x_0 \\ &= \beta_M(\alpha)x + \alpha\end{aligned} \tag{18}$$

Therefore, taking $x_0$ as a parameter, $\beta_M$ was obtained from:

$$\alpha = (2\ln x_0 - 1)/x_0 \tag{19a}$$

$\beta_M=(1-\ln x_0)/x_0^2$  (19b)

Figure 2:
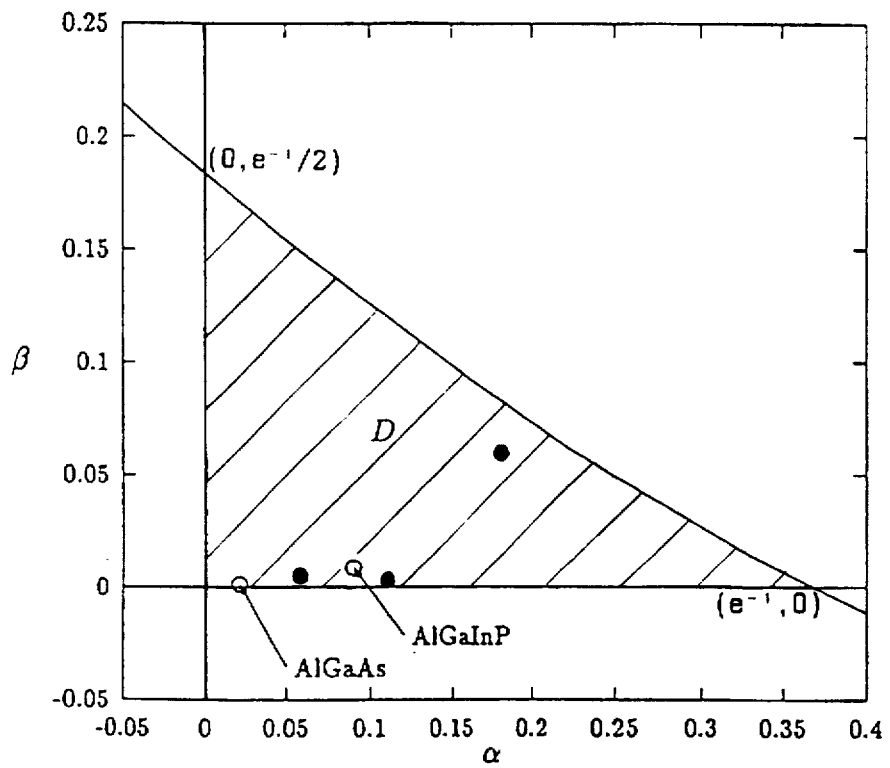
FIG. 2 is a graph for explaining the principle of the invention.

A result of actual calculation thereof by using a computer is shown in FIG. 2.

It is known from the foregoing description that, in order that the curve of equation (14) and the straight line of equation (15) have a point of intersection, the point $(\alpha, \beta)$ must exist in an area D surrounded by the $\alpha$-axis, i.e. the straight line $\beta=0$, the $\beta$-axis, i.e. the straight line $\alpha=0$, and a curve $((2\ln x_0-1)/x_0, (1-\ln x_0)/x_0^2)$ having $x_0$ as a parameter.

This invention has been made on the basis of the above-realization by the present Inventors.

That is, in order to accomplish the above-indicated object, there is provided a semiconductor laser comprising: a first cladding layer of a first conduction type; an active layer stacked on the first cladding layer; and a second cladding layer of a second conduction type stacked on the active layer, wherein:

the first cladding layer, the active layer and the second cladding layer are made of II-VI compound semiconductors, and pulse oscillation occurs with characteristics of a threshold current $I_{th}(A)$, a threshold voltage $V_{th}(V)$ of the diode composed of the first cladding layer, the active layer and the second cladding layer (7), a differential resistance $R_S(\Omega)$ of the diode after the rising, a thermal resistance $R_t(K/W)$ and a characteristic temperature $T_0(K)$, and wherein:

when two amounts $\alpha$ and $\beta$ are defined by:

$\alpha \equiv (R_t/T_0)I_{th}V_{th}$ $\beta \equiv (R_t/T_0)R_S I_{th}^2$ the point $(\alpha, \beta)$ exists in an area on the $\alpha$-$\beta$ plane surrounded by the straight line $\alpha=0$, the straight line $\beta=0$, and the curve $((2\ln t-1)/t, (1-\ln t)/t^2)$ having t as a parameter.

In a working form of the semiconductor laser according to the invention, the semiconductor laser includes a first optical waveguide layer between the first cladding layer and the active layer and includes a second optical waveguide layer between the second cladding layer and the active layer, the first optical waveguide layer and the second optical waveguide layer being made of II-IV compound semiconductors.

In a preferred working form of the semiconductor laser according to the invention, II-VI compound semiconductors making the first cladding layer and the second cladding layer are a ZnMgSSe compound semiconductor.

According to the invention, in a semiconductor laser for pulse oscillation with characteristics of a threshold current $I_{th}(A)$, a threshold voltage $V_{th}(V)$ of the diode, the differential resistance $R_S(\Omega)$ of the diode after the rising, the thermal resistance $R_t(K/W)$, and the characteristic temperature $T_0(K)$, it is possible to realize a semiconductor laser using II-VI compound semiconductors and having the capability of continuous oscillation at high temperatures including the room temperature by designing and fabricating it such that, when two amounts $\alpha$ and $\beta$ are defined by $\alpha \equiv (R_t/T_0)I_{th}V_{th}$ and $\beta \equiv (R_t/T_0)R_S I_{th}^2$, the point $(\alpha, \beta)$ exists in an area on the $\alpha$-$\beta$ plane surrounded by the straight line $\alpha=0$, the straight line $\beta=0$ and the curve $((2\ln t-1)/t, (1-\ln t)/t^2)$ having t as a parameter.

In particular, by using ZnMgSSe compound semiconductors among II-VI compound semiconductors as materials of the cladding layers and the optical waveguide layers, it is possible to realize a semiconductor laser capable of emitting, for example, blue to green light, and a semiconductor laser capable of emitting light in the near-ultraviolet range, depending on a material chosen for the active layer.

Embodiments of the invention are described below with reference to the drawings. In all the drawings of embodiments, identical or corresponding elements are labelled with the same reference numerals.

Figure 3:
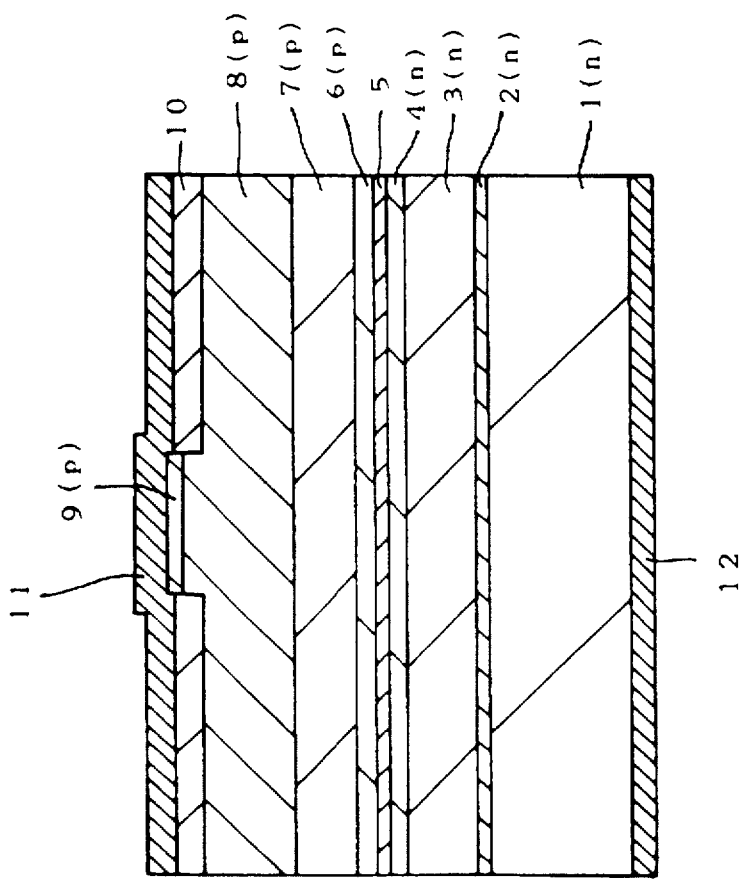
FIG. 3 is a cross-sectional view showing a semiconductor laser according to a first embodiment of the invention.

FIG. 3 shows a semiconductor laser according to a first embodiment of the invention. The semiconductor laser according to the first embodiment has an SCH (separated confinement heterostructure) structure.

As shown in FIG. 3, the semiconductor laser according to the first embodiment uses an n-type GaAs substrate 1 having the (100) orientation and doped with Si, for example, as an n-type impurity. Sequentially stacked on the n-type GaAs substrate 1 are an n-type ZnSe buffer layer 2 doped with, for example, Cl as an n-type impurity; an n-type $Zn_{1-p}Mg_pS_qSe_{1-q}$ cladding layer 3 doped with, for example, Cl as an n-type impurity; an n-type ZnSe optical waveguide layer 4 doped with, for example, Cl as an n-type impurity; an active layer 5; a p-type ZnSe optical waveguide layer 6 doped with, for example N as a p-type impurity; a p-type $Zn_{1-p}Mg_pS_qSe_{1-q}$ cladding layer 7 doped with, for example, N as a p-type impurity; a p-type $ZnS_ySe_{1-y}$ layer 8 doped with, for example, N as a p-type impurity; and a p-type ZnSe contact layer 9 doped with, for example, N as a p-type impurity.

In this case, the p-type ZnSe contact layer 9 and an upper portion of the p-type $ZnS_ySe_{1-y}$ layer 8 are patterned in the form of stripes. The width of each stripe portion is, for example, 5 μm.

Further provided on the p-type $ZnS_ySe_{1-y}$ except the stripe portions is an insulating layer 10 in the form of, for example, a 300 nm thick alumina ($Al_2O_3$) film. Formed on the stripe-shaped p-type ZnSe contact layer 9 and on the insulating layer 10 is a p-side electrode 11. The portion where the p-side electrode 11 contacts the p-type ZnSe contact layer 9 behaves as a flow path of the electric current. The p-side electrode 11 may be made, for example, as an Au/Pt/Pd electrode made by sequentially stacking a 10 nm thick Pd film, a 100 nm thick Pt film and a 300 nm thick Au film. On the other hand, an n-side electrode such as In electrode contacts the back surface of the n-type GaAs substrate 1.

Figure 4:
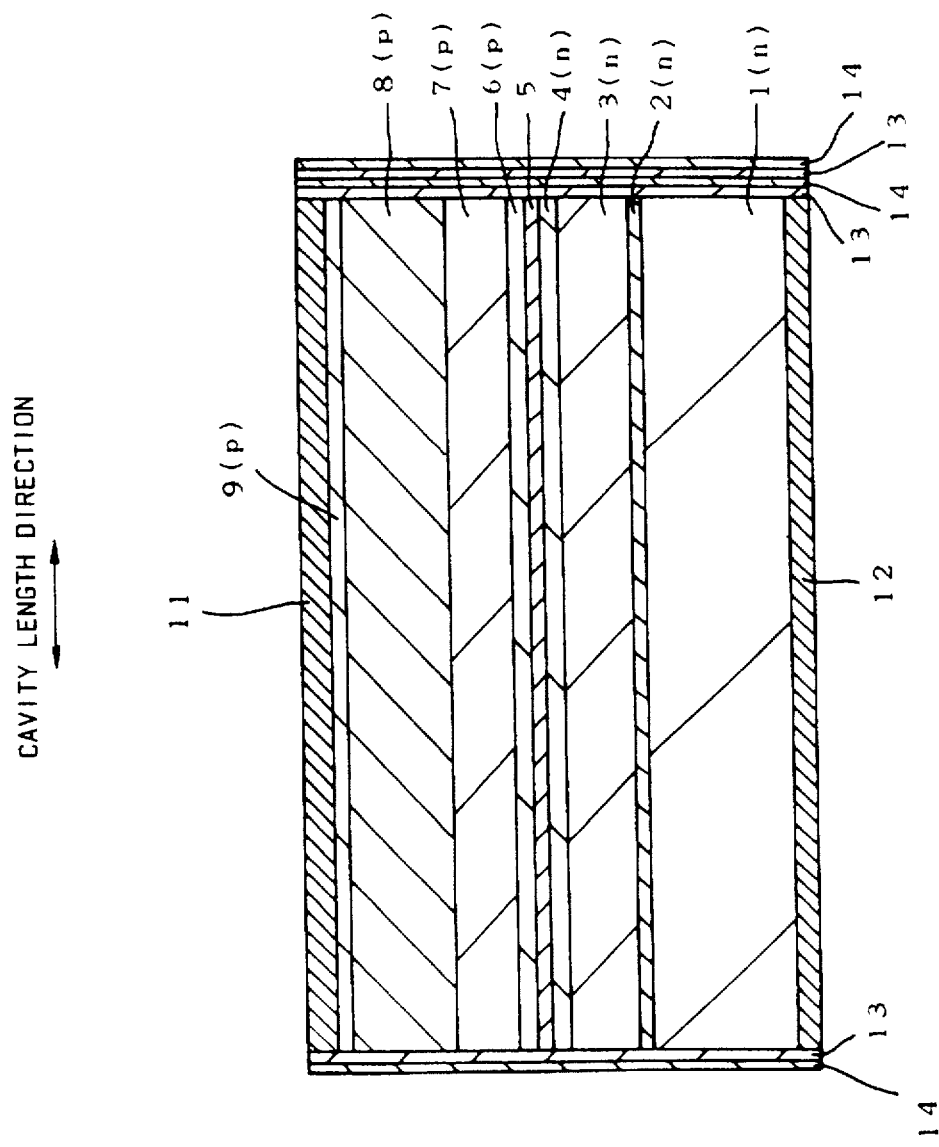
FIG. 4 is a cross sectional view of the semiconductor laser according to the first embodiment of the invention.

The semiconductor laser according to the first embodiment are end-coated. More specifically, FIG. 4 is a cross-sectional view taken along a plane parallel to the cavity length direction of the semiconductor laser. As shown in FIG. 4, the front one of a pair of cavity end surfaces vertical to the cavity length direction, from which a laser beam is taken out, is coated with a multi-layered film composed of a 74 nm thick $Al_2O_3$ film 13 and a 31 nm thick Si film 14, and the rear one of the pair of cavity end surfaces vertical to the cavity length direction, from which a laser beam is not taken out, is coated with a multi-layered film made by stacking two cycles of 74 nm thick $Al_2O_3$ films 13 and 31 nm thick Si films 14. The thickness of the multi-layered films composed of the $Al_2O_3$ film(s) 13 and the Si film(s) 14 is chosen such that the optical distance obtained by multiplying it by its refraction factor equals ¼ of the wavelength of oscillation of a laser beam. In this case, the refraction factor of the front end surface is 70%, and the refraction factor of the rear end surface is 95%.

In the first embodiment, the active layer 5 is preferably 2 nm-20 nm thick, and has a single quantum well structure including an i-type $Zn_{1-z}Cd_zSe$ quantum well layer having the thickness of, for example, 9 nm. In this case, the n-type ZnSe optical waveguide layer 4 and the p-type ZnSe optical waveguide layer 6 behave as barrier layers.

The Mg composition ratio p of the n-type $Zn_{1-p}Mg_pS_qSe_{1-q}$ cladding layer 3 and the p-type $Zn_{1-p}Mg_pS_qSe_{1-q}$ cladding layer 7 is, for example, 0.09, the S composition ratio q thereof is, for example, 0.18, and their band gap $E_g$ is about 2.94 eV at 77K. The n-type $Zn_{1-p}Mg_pS_qSe_{1-q}$ cladding layer 3 and the p-type $Zn_{1-p}Mg_pS_qSe_{1-q}$ cladding layer 7 having the Mg composition ratio p=0.09 and the S composition ratio q=0.18 are in lattice matching with GaAs. The Cd composition ratio z of the i-type $Zn_{1-z}Cd_zSe$ quantum well layer of the active layer 5 is, for example, 0.19, and the band gap $E_g$ is about 2.54 eV at 77K. In this case, the difference $\Delta E_g$ between the band gap $E_g$ of the n-type $Zn_{1-p}Mg_pS_qSe_{1-q}$ cladding layer 3 and the p-type $Zn_{1-p}Mg_pS_qSe_{1-q}$ cladding layer 7 and the band gap $E_g$ of the i-type $Zn_{1-z}Cd_zSe$ quantum well layer forming the active layer 5 is 0.40 eV. Values of band gaps $E_g$ at the room temperature can be obtained by subtracting 0.1 eV from the values of the band gaps $E_g$ at 77K.

In this case, the thickness of the n-type $Zn_{1-p}Mg_pS_qSe_{1-q}$ cladding layer 3 is, for example, 1.5 μm thick, and has the impurity concentration of, for example, $5 \times 10^{17}$ cm$^{-3}$ in $N_D-N_A$ ($N_D$ is the donor concentration, and $N_A$ is the acceptor concentration). The n-type ZnSe waveguide layer 4 is, for example, 80 nm thick, and has the impurity concentration of, for example, $5 \times 10$ cm$^{-3}$ in $N_D-N_A$. The p-type ZnSe waveguide layer 6 is, for example, 80 nm thick, and has the impurity concentration of, for example, $5 \times 10$ cm$^{-3}$ in $N_A-N_D$. The p-type $Zn_{1-p}Mg_pS_qSe_{1-q}$ cladding layer 7 is, for example, 0.8 μm thick, and has the impurity concentration of, for example, $2 \times 10^{17}$ cm$^{-3}$ in $N_A-N_D$. The p-type $ZnS_vSe_{1-v}$ layer 8 is, for example, 0.8 μm thick, and has the impurity concentration of, for example, $8 \times 10^{17}$ cm$^{-3}$ in $N_A-N_D$. The p-type ZnSe contact layer 9 is, for example, 45 nm thick, and has the impurity concentration of $8 \times 10^{17}$ cm$^{-3}$ in $N_A-N_D$.

Since small lattice mismatching exists between ZnSe and GaAs, dislocation may occur due to the lattice mismatching during epitaxial growth of the n-type ZnSe buffer layer 2 and other layers thereon. To prevent this, the thickness of the n-type ZnSe buffer layer 2 is chosen to be sufficiently smaller than the critical thickness of ZnSe (~100 nm), that is, for example, 33 nm in the first embodiment.

The cavity length L of the semiconductor laser according to the first embodiment is chosen to be, for example, 640 μm, and the width in the direction vertical to the cavity length direction is chosen to be, for example, 400 μm.

In the first embodiment, the p-type $ZnS_vSe_{1-v}$ layer 8 stacked on the p-type $Zn_{1-p}Mg_pS_qSe_{1-q}$ layer 7 has two or more functions, depending on cases, among the function as the second p-type cladding layer added to the p-type $Zn_{1-p}Mg_pS_qSe_{1-q}$ cladding layer 7, the function of providing lattice matching with the p-type $Zn_{1-p}Mg_pS_qSe_{1-q}$ cladding layer 7, the function as a spacer layer for preventing a short circuit caused by a solder creeping up along the chip end surfaces when a laser chip is mounted on a heat sink, as will be described later, and other functions. Although the Mg composition ratio and the S composition ratio q of the p-type $Zn_{1-p}Mg_pS_qSe_{1-q}$ cladding layer 7 must be taken into consideration, the S composition ratio v of the p-type $ZnS_vSe_{1-v}$ layer 8 is chosen in the range of $0 < v \leq 0.1$ and preferably $0.06 \leq v \leq 0.08$, and the optimum S composition ratio v for lattice matching with the p-type $Zn_{1-p}Mg_pS_qSe_{1-q}$ cladding layer 7 is 0.06.

Stacking the p-type $ZnS_vSe_{1-v}$ layer 8 on the p-type $Zn_{1-p}Mg_pS_qSe_{1-q}$ cladding layer 7 provides the following various advantages. That is, when the p-type $ZnS_vSe_{1-v}$ layer 8 is used as the second p-type cladding layer, it is possible to minimize the thickness of the second cladding layer 7 whose epitaxial growth is not so easy as a binary or ternary II-V compound semiconductor, thereby so much facilitating fabrication of the semiconductor laser. Further, if the thickness of the entire p-type cladding layer is identical, the resistance of the p-type cladding layer can be made lower in the arrangement in which the p-type cladding layer is composed of the p-type $Zn_{1-p}Mg_pS_qSe_{1-q}$ cladding layer 7 and the p-type $ZnS_vSe_{1-v}$ layer 8 than in the arrangement in which the p-type cladding layer consists of the p-type $Zn_{1-p}Mg_pS_qSe_{1-q}$ cladding layer 7 alone. In particular, when the p-type $Zn_{1-p}Mg_pS_qSe_{1-q}$ cladding layer 7 having the thickness of about 0.8 μm and $N_A-N_D$ of about $2 \times 10^{17}$ cm$^{-3}$ and the p-type $ZnS_vSe_{1-v}$ layer 8 having the thickness of about 0.8 μm and $N_A-N_D$ of about $8 \times 10^{17}$ cm$^{-3}$, the resistance of the entire p-type cladding layer can be made sufficiently low without deteriorating the optical confinement characteristics and the carrier confinement characteristics.

If the p-type ZnSe contact layer 9 is directly stacked on the p-type $Zn_{1-p}Mg_pS_qSe_{1-q}$ cladding layer 7, the crystalline quality would be deteriorated due to lattice mismatching between these layers. In the embodiment, however, since the p-type $ZnS_vSe_{1-v}$ layer 8 having substantially the same lattice constant as that of the p-type $Zn_{1-p}Mg_pS_qSe_{1-q}$ cladding layer 7 is stacked on the p-type $Zn_{1-p}Mg_pS_qSe_{1-q}$ cladding layer and the p-type ZnSe contact layer 9 is stacked on the p-type $ZnS_vSe_{1-v}$ layer 8, good crystalline qualities of the p-type $ZnS_vSe_{1-v}$ layer 8 and the p-type ZnSe contact layer 9 can be realized.

Figure 5:
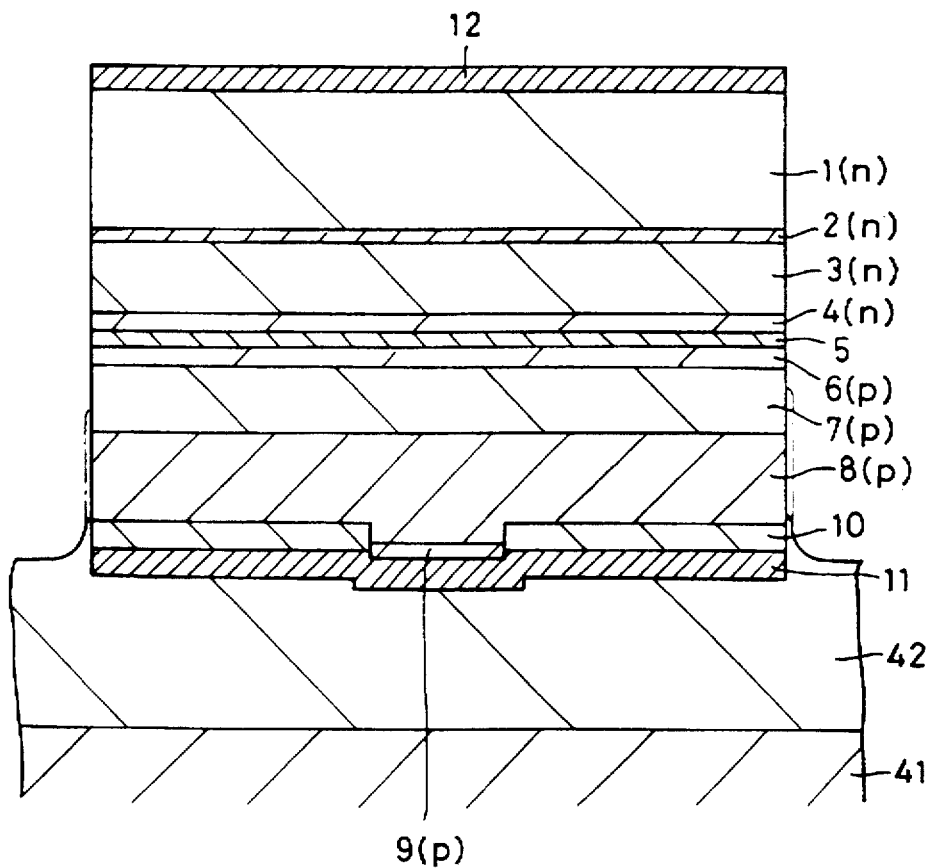
FIG. 5 is a cross-sectional view showing the semiconductor laser according to the first embodiment of the invention mounted on a heat sink.

Additionally, by providing the p-type $ZnS_vSe_{1-v}$ layer 8 with a sufficient thickness, it can be effectively prevented that a solder used to mount a laser chip on a heat sink creeps up along the end surfaces of the laser chip and makes a short circuit between the p-side and the n-side. More specifically, as shown in FIG. 5, when a laser chip is mounted on a heat sink 41 in p-side down by orienting the p-side electrode 11 downward, no problem would arise if the solder 42 remains only between the laser chip and the heat sink 41 as shown by the solid line. Even if the solder creeps up, for example, in the form of lines, along the end surfaces of the laser chip as shown by the dash-and-dot lines because of a somewhat rough soldering, a sufficiently large thickness of the p-type $ZnS_vSe_{1-v}$ layer 8 can prevent the solder 42 from creeping up along the end surfaces of the laser chip and reaching the n-type ZnSe optical waveguide layer 4 and the n-type $Zn_{1-p}Mg_pS_qSe_{1-q}$ cladding layer 3 beyond the active layer 5. Typically, the creeping-up of the solder 42 can be terminated far below the active layer 5. As a result, the embodiment can prevent short circuiting of the p-side and the n-side of the laser chip during the mounting thereof, and thereby facilitating the mounting of the laser chip.

Next explained is a method of fabricating the semiconductor laser according to the first embodiment.

Figure 6:
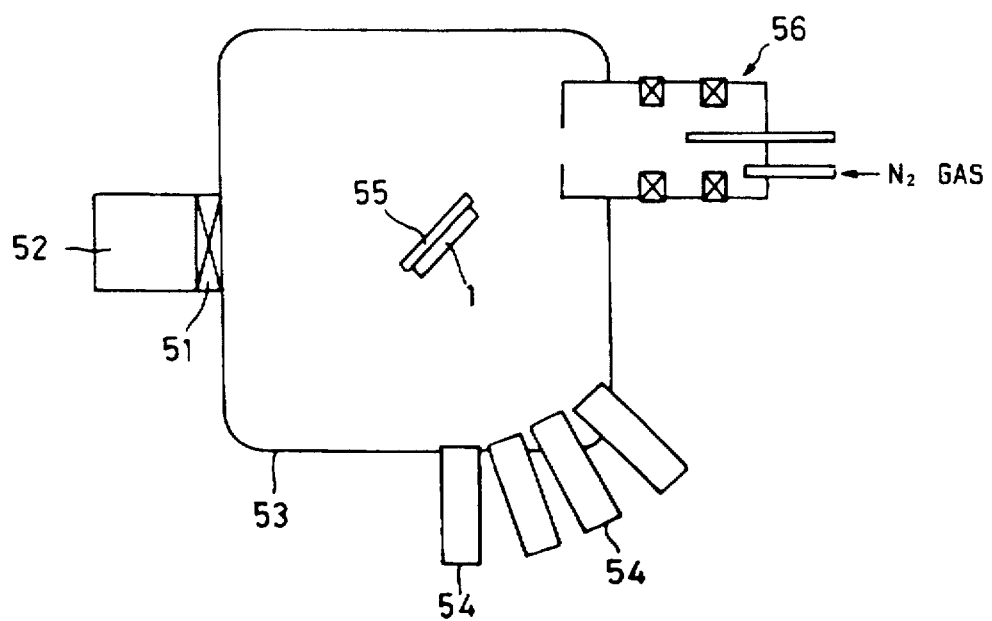
FIG. 6 is a schematic view showing a MBE apparatus used for fabricating the semiconductor laser according to the first embodiment of the invention.

FIG. 6 shows a molecular beam epitaxy (MBE) apparatus used in the method of fabricating the semiconductor laser according to the first embodiment for epitaxially growing respective layers constituting the laser structure. As shown in FIG. 6, the MBE apparatus includes a plurality of molecular beam sources (K cells) 54, a substrate holder 55 for holding a substrate for epitaxial growth thereon, and an electron cyclotron resonance (ECR) plasma cell 56 which are contained in a vacuum container 53 which can be evacuated into ultrahigh vacuum by an ultrahigh evacuating apparatus 52 connected thereto via a gate valve 51.

To fabricate the semiconductor laser according to the first embodiment, an n-type GaAs substrate 1 is first set on a substrate holder 55 in the vacuum container 53 of the MBE apparatus shown in FIG. 6. The n-type GaAs substrate 1 is then heated to a temperature sufficiently higher than the growth temperature, for example, to 580° C., for cleaning the surface. After that, the temperature of the n-type GaAs substrate 1 is decreased to a predetermined epitaxial growth temperature, preferably in the range of 250°–300° C., more preferably in the range of 280°–300° C., specifically to 295° C., to start the epitaxial growth. That is, by using the MBE method, epitaxially grown in sequence on the n-type GaAs substrate 1 are the n-type ZnSe buffer layer 2, the n-type $Zn_{1-p}Mg_pS_qSe_{1-q}$ cladding layer 3, the n-type ZnSe optical waveguide layer 4, the active layer 5 composed of the i-type $Zn_{1-z}Cd_zSe$ quantum well layer, the p-type ZnSe optical waveguide layer 6, the p-type $Zn_{1-p}Mg_pS_qSe_{1-q}$ cladding layer 7, the p-type $ZnS_ySe_{1-y}$ layer 8, and the p-type ZnSe contact layer 9. In this case, it is possible to epitaxially grow these layers with good crystalline qualities, to hence suppress deteriorations such as a decrease in light output of the semiconductor laser and to obtain a high reliability.

The epitaxial growth by the MBE method uses Zn having the purity of 99.9999% as the source of Zn, Mg having the purity of 99.9% as the source of Mg, Zns having the purity of 99.9999% as the source of S, and Se having the purity of 99.9999% as the source of Se. Further, doping of Cl as the n-type impurity into the n-type ZnSe buffer layer 2, n-type $Zn_{1-p}Mg_pS_qSe_{1-q}$ cladding layer 3 and n-type ZnSe optical waveguide layer 4 is done by using, for example, $ZnCl_2$ having the purity of 99.9999% as the dopant. On the other hand, doping of N as the p-type impurity to the p-type ZnSe optical waveguide layer 6, p-type $Zn_{1-p}Mg_pS_qSe_{1-q}$ cladding layer 7 and p-type ZnSe contact layer 9 is done by irradiating $N_2$ plasma blasted by ECR, for example.

After that, a stripe-shaped resist pattern (not shown) with a predetermined width is formed on the p-type ZnSe contact layer 9, and the p-type $ZnS_ySe_{1-y}$ layer 8 is etched up to an intermediate portion in its thickness direction by a wet etching method using the resist pattern as a mask. As a result, the p-type ZnSe contact layer 9 and an upper portion of the p-type $ZnS_ySe_{1-y}$ layer 8 are patterned into stripes.

After that, while maintaining the resist pattern used by the etching, an $Al_2O_3$ film is deposited on the entire surface by vacuum evaporation. Thereafter, the resist pattern and the $Al_2O_3$ film thereon are removed (lift-off). As a result, an insulating layer 10 composed of the $Al_2O_3$ is formed only on the p-type $ZnS_ySe_{1-y}$ layer 8 in the areas other than the stripe portions.

Next formed on the entire surface including the stripe-shaped p-type ZnSe contact layer 9 and the insulating layer 10 is the p-side electrode composed of an Au/Pt/Pd electrode made by sequentially depositing Pd, Pt and Au films by vacuum evaporation. Then, after a heat treatment, if necessary, the p-side electrode 11 is brought into ohmic contact with the p-type ZnSe contact layer 9. Formed on the back surface of the n-type GaAs substrate 1 is the n-side electrode 12 such as In electrode.

After that, the n-type GaAs substrate 1 provided with the laser structure thereon is cleaved into bars having the width of 640 μm, for example, to thereby make cavity end surfaces. After that, by vacuum evaporation, a multi-layered film composed of an $Al_2O_3$ film 13 and a Si film 14 is formed on the front end surface, and a multi-layered film made by repeating two cycles of $Al_2O_3$ films 13 and Si films 14 is formed on the rear end surface. After such end coating, the bar is cleaved into chips having the width of 400 μm, and the chips are packaged.

Figure 7:
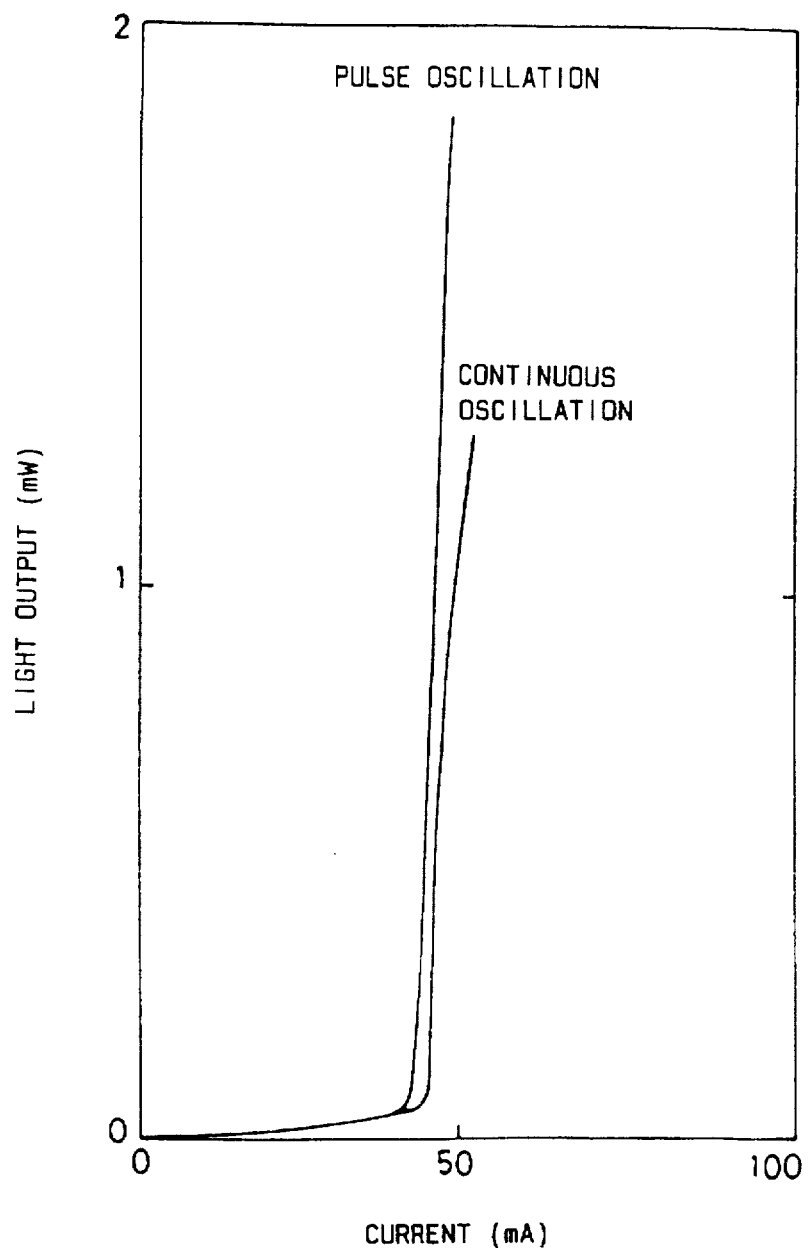
FIG. 7 is a graph showing a result of measurement of characteristics of the semiconductor laser according to the first embodiment of the invention in term of the light output relative to the current at the room temperature.

FIG. 7 shows a result of measurement of characteristics, in term of the light output relative to the injected current, which was conducted with the semiconductor laser according to the first embodiment at the room temperature (296K) by applying a continuous flow of the injected current and by applying a pulsating flow of the injected current. The measurement was conducted by mounting the laser chip in p-side down on the heat sink 41 of copper as shown in FIG. 5. As apparent from FIG. 7, the threshold current $I_{th}$ with a continuous flow of the injected current is about 45 mA which corresponds to the threshold current density $J_{th}$ of about 1.5 kA/cm$^2$. On the other hand, the threshold current $I_{th}$ with a pulsating flow of the injected current is about 42 mA. Note that the measurement of the characteristics in term of the light output relative to the current with a continuous flow of the injected current was conducted by increasing the injected current from 0 to 100 mA at the speed of 500 mA/second. On the other hand the measurement of the characteristics in term of the light output relative to the current with a pulsating flow of the injected current was conducted by applying the injected current with the pulse width of 2 μm at intervals of 1 ms. As apparent from FIG. 7, the slope efficiencies $S_d$ with the pulsating flow of the injected current and with the continuous flow of the injected current are 0.34 W/A and 0.31 W/A, respectively. The applied voltage between the p-side electrode 11 and the n-side electrode 12 at the threshold value of the laser oscillation is about 17 V.

Figure 8:
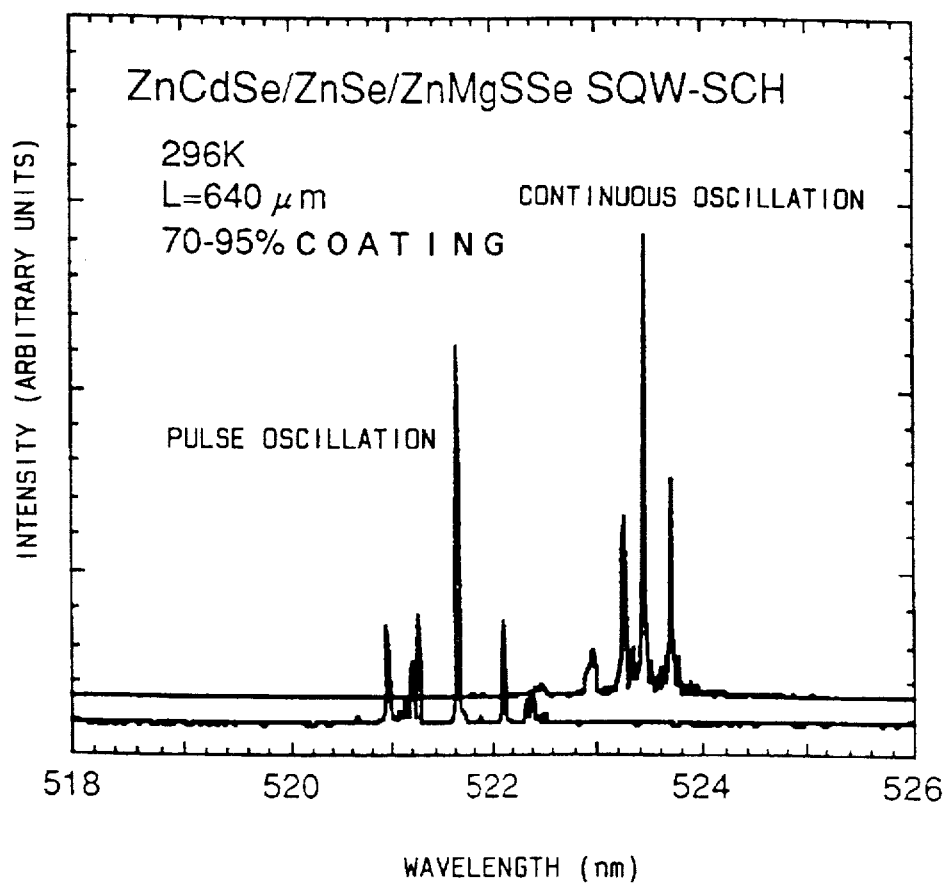
FIG. 8 is a graph showing a result of measurement of the spectrum of emitted light at the room temperature by the semiconductor laser according to the first embodiment of the invention.

FIG. 8 shows a result of measurement of the spectrum of light emitted from the semiconductor laser oscillated at the room temperature (296K). As apparent from FIG. 8, induced emissions with wavelengths of 521.6 nm and 523.5 nm are observed by a pulsating operation and by a continuous operation, respectively.

Values of $\alpha$ and $\beta$ for the semiconductor laser according to the first embodiment are as follows. That is, the foregoing measurement results in $I_{th}$(pulse)=42 mA=0.042 A and $V_{th}$=17 V. Further, $R_S$=10Ω, $R_t$=23 K/W, and $T_0$=150K. By substitution in equations (10) and (11) with these values, $\alpha$=0.11 and 0=0.0027. In FIG. 2, ($\alpha$, $\beta$)=(0.11, 0.0027) has been plotted with a black point. It is known from FIG. 2 that (0.11, 0.0027) certainly exists in the area D. In other words, continuous oscillation at the room temperature has been made possible as described above by designing and fabricating the semiconductor laser such that ($\alpha$, $\beta$) exists in the area D. For reference, ($\alpha$, $\beta$) for a semiconductor laser using AlGaAs compound semiconductors and ($\alpha$, $\beta$) for a semiconductor laser using AlGaInP compound semiconductors are also plotted in FIG. 2 with white circles. It is recognized that they both exist in the area D.

In the calculation made above, the Cd composition ratio z of the i-type $Zn_{1-z}Cd_zSe$ quantum well layer forming the active layer 5 has been 0.19. If, however, the Cd composition ratio z is chosen as 0.13, values of $\alpha$ and $\beta$ become as follows. In this case, $I_{th}$(pulse)=200 mA=0.2 A and $V_{th}$=6 V. On the other hand, values of $R_S$, $R_t$ and $T_0$ are identical to the above-indicated values. Using these values result in $\alpha$=0.18 and $\beta$=0.061. ($\alpha$, $\beta$)=(0.18, 0.061) has also been plotted in FIG. 2. It is apparent from FIG. 2 that (0.18, 0.061) certainly exists in the area D.

In general, as the Cd composition ration z of the i-type $Zn_{1-z}Cd_zSe$ quantum well layer forming the active layer 5 increases, $I_{th}$(pulse) decreases, and $T_0$ increases. Further, as the Mg composition ratio p and the S composition ratio q of the n-type $Zn_{1-p}Mg_pS_qSe_{1-q}$ cladding layer 3 and the p-type $Zn_{1-p}Mg_pS_qSe_{1-q}$ cladding layer 7, the band gap $E_g$ increases, $I_{th}$(pulse) decrease, $T_0$ increases, $R_S$ increases, and $R_t$ increases. Further, as the impurity concentration of the n-type ZnSe optical waveguide layer 4 and/or the impurity concentration of the p-type ZnSe optical waveguide layer 6 increase(s), $R_S$ decreases, and $T_O$ decreases. In addition, end coating decreases $I_{th}$(pulse).

As apparent from the foregoing description, the first embodiment can realize a semiconductor laser capable of emitting green light by continuous oscillation with the wavelength of 523.5 nm at the room temperature and having the SCH structure with a low threshold current density. This semiconductor laser generates only a small amount of heat during operation, and can be fabricated easily.

When the Cd composition ratio z of the i-type $Zn_{1-z}Cd_zSe$ quantum well layer constituting the active layer 5 is 0.05, the band gap $E_g$ is 2.72 ev at 77K. When the Mg composition ratio p and the S composition ratio q of the n-type $Zn_{1-p}Mg_pS_qSe_{1-q}$ cladding layer 3 and the p-type $Zn_{1-p}Mg_pS_qSe_{1-q}$ cladding layer 7 are 0.17 and 0.24, respectively, the band gap $E_g$ is 3.07 eV at 77K. Then, the difference $\Delta E_g$ between the band gap $E_g$ of the n-type $Zn_{1-p}Mg_pS_qSe_{1-q}$ cladding layer 3 and the p-type $Zn_{1-p}Mg_pS_qSe_{1-q}$ cladding layer 7 and the band gap $E_g$ of the i-type $Zn_{1-z}Cd_zSe$ quantum well layer constituting the active layer 5 is 0.35 eV. In this case, the wavelength of oscillation is about 473 nm.

When the Cd composition ratio z of the i-type $Zn_{1-z}Cd_zSe$ quantum well layer constituting the active layer 5 is 0.10, the band gap $E_g$ is 2.65 eV at 77K. When the Mg composition ratio p and the S composition ratio q of the n-type $Zn_{1-p}Mg_pS_qSe_{1-q}$ cladding layer 3 and the p-type $Zn_{1-p}Mg_pS_qSe_{1-q}$ cladding layer 7 are 0.13 and 0.21, respectively, the band gap $E_g$ is 3.00 eV at 77K. Then, the difference $\Delta E_g$ between the band gap E of the n-type $Zn_{1-p}Mg_pS_qSe_{1-q}$ cladding layer 3 and the p-type $Zn_{1-p}Mg_pS_qSe_{1-q}$ cladding layer 7 and the band gap $E_g$ of the i-type $Zn_{1-z}Cd_zSe$ quantum well layer constituting the active layer 5 is 0.35 eV. In this case, the wavelength-of oscillation is about 486 nm.

When the Cd composition ratio z of the i-type $Zn_{1-z}Cd_zSe$ quantum well layer constituting the active layer 5 is 0.12, the band gap $E_g$ is 2.62 eV at 77K. When the Mg composition ratio p and the S composition ratio q of the n-type $Zn_{1-p}Mg_pS_qSe_{1-q}$ cladding layer 3 and the p-type $Zn_{1-p}Mg_pS_qSe_{1-q}$ cladding layer 7 are 0.10 and 0.17, respectively, the band gap $E_g$ is 2.97 eV at 77K. Then, the difference $\Delta E_g$ between the band gap $E_g$ of the n-type $zn_{1-p}Mg_pS_qSe_{1-q}$ cladding layer 3 and the p-type $Zn_{1-p}Mg_qS_qSe_{1-q}$ cladding layer 7 and the band gap $E_g$ of the i-type $Zn_{1-z}Cd_zSe$ quantum well layer constituting the active layer 5 is 0.35 eV. In this case, the wavelength of oscillation is about 491 nm.

When the Cd composition ratio z of the i-type $Zn_{1-z}Cd_zSe$ quantum well layer constituting the active layer 5 is 0.20, the band gap $E_g$ is 2.51 eV at 77K. When the Mg composition ratio p and the S composition ratio q of the n-type $Zn_{1-p}Mg_pS_qSe_{1-q}$ cladding layer 3 and the p-type $Zn_{1-p}Mg_pS_qSe_{1-q}$ cladding layer 7 are 0.03 and 0.08, respectively, the band gap $E_g$ is 2.86 eV at 77K. Then, the difference $\Delta E_g$ between the band gap $E_g$ of the n-type $Zn_{1-p}Mg_pS_qSe_{1-q}$ cladding layer 3 and the p-type $Zn_{1-p}Mg_pS_qSe_{1-q}$ cladding layer 7 and the band gap $E_g$ of the i-type $Zn_{1-z}Cd_zSe$ quantum well layer constituting the active layer 5 is 0.35 eV. In this case, the wavelength of oscillation is about 514 nm.

Figure 9:
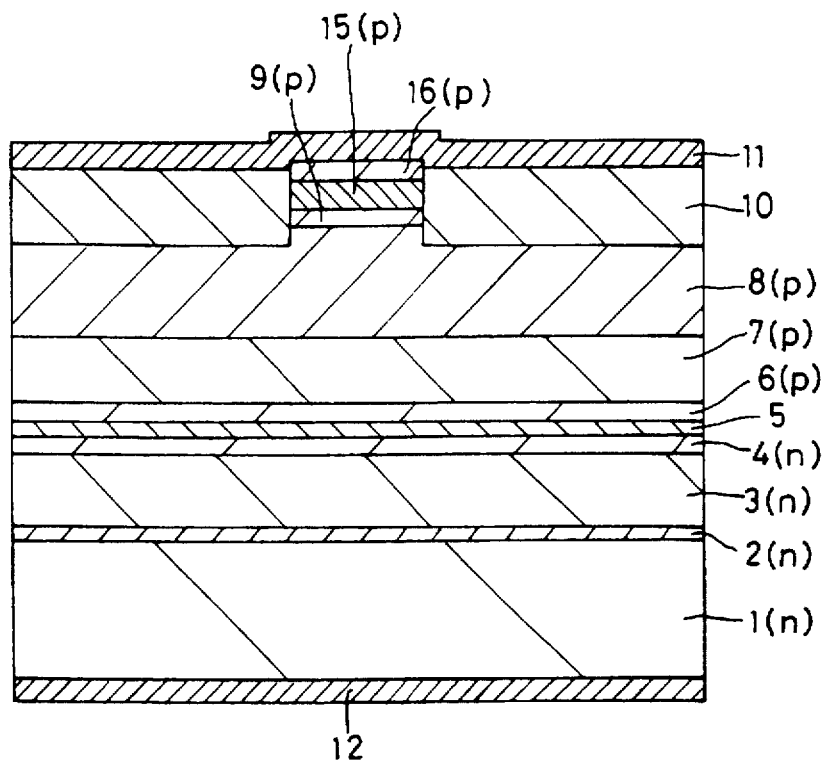
FIG. 9 is a cross-sectional view showing a semiconductor laser according to a second embodiment of the invention.

FIG. 9 shows a semiconductor laser according to a second embodiment of the invention. The semiconductor laser according to the second embodiment also has a SCH structure.

As shown in FIG. 9, the semiconductor laser according to the second embodiment uses an n-type GaAs substrate 1 having the (100) orientation and doped with Si, for example, as an n-type impurity. Sequentially stacked on the n-type GaAs substrate 1 are an n-type ZnSe buffer layer 2 doped with, for example, Cl as an n-type impurity; an n-type $Zn_{1-p}Mg_pS_qSe_{1-q}$ cladding layer 3 doped with, for example, Cl as an n-type impurity; an n-type ZnSe optical waveguide layer 4 doped with, for example, Cl as an n-type impurity; an active layer 5; a p-type ZnSe optical waveguide layer 6 doped with, for example N as a p-type impurity; a p-type $Zn_{1-p}Mg_pS_qSe_{1-q}$ cladding layer 7 doped with, for example, N as a p-type impurity; a p-type $ZnS_vSe_{1-v}$ layer 8 doped with, for example, N as a p-type impurity; a p-type ZnSe contact layer 9 doped with, for example, N as a p-type impurity; a p-type ZnTe/ZnSe multiquantum well (MQW) layer 15 composed of p-type ZnTe quantum well layers and p-type ZnSe barrier layers stacked alternately; and a p-type ZnTe contact layer 16 doped with, for example, N as a p-type impurity. The p-type ZnTe/ZnSe MQW layer 15 will be described later in greater detail.

In this case, the p-type ZnTe contact layer 16, p-type ZnTe/ZnSe MQW layer 15, the p-type ZnSe contact layer 9 and an upper portion of the p-type $ZnS_vSe_{1-v}$ layer 8 are patterned in the form of stripes. The width of each stripe portion is, for example, 5 μm.

The second embodiment is the same as the first embodiment in that an insulating layer 10 in the form of an alumina ($Al_2O_3$) film on the p-type $ZnS_vSe_{1-v}$ except the stripe portions. In this case, the p-side electrode is formed on the stripe-shaped p-type ZnTe contact layer 16 and on the insulating layer 10. An Au/Pt/Pd electrode, for example, may be used as the p-side electrode like in the first embodiment. The second embodiment is also the same as the first embodiment in that the n-side electrode 12 such In electrode contacts the rear surface of the n-type GaAs substrate 1.

The semiconductor laser according to the second embodiment is also end-coated, although not shown, like the semiconductor laser according to the first embodiment.

In the second embodiment, the active layer 5 is preferably 2 nm–20 nm thick, and has a single quantum well structure including an i-type $Zn_{1-z}Cd_zSe$ quantum well layer having the thickness of, for example, 9 nm. In this case, the n-type ZnSe optical waveguide layer 4 and the p-type ZnSe optical waveguide layer 6 behave as barrier layers, like in the first embodiment.

The second embodiment is the same as the first embodiment in the Mg and S composition ratios p and q of the n-type $Zn_{1-p}Mg_pS_qSe_{1-q}$ cladding layer 3, n-type ZnSe optical waveguide layer 4, p-type ZnSe optical waveguide layer 6, p-type $Zn_{1-p}Mg_pS_qSe_{1-q}$ cladding layer 7, p-type $ZnS_vSe_{1-v}$ layer 8 and p-type ZnSe contact layer 9. The thickness of the p-type ZnTe contact layer 16 is, for example, 70 nm, and its impurity concentration is, for example, $1\times10^{19}$ cm$^3$.

The cavity length L of the semiconductor laser according to the second embodiment is chosen to be, for example, 640 μm, and the width in the direction vertical to the cavity length direction is chosen to be, for example, 400 μm, like in the semiconductor laser according to the first embodiment.

The p-type ZnTe/ZnSe MQW layer 15 is provided for the following purpose. That is, direct contact of the p-type ZnSe contact layer 9 with the p-type ZnTe contact layer 16 causes a large discontinuity in valence bands along their boundary, which acts as a barrier against holes injected from the p-side electrode 11 to the p-type ZnTe contact layer 16. The barrier, however, is effectively removed by interposing the p-type ZnTe/ZnSe MQW layer 15.

That is, the maximum carrier concentration in p-type ZnSe is typically on the order of $5 \times 10^{17}$ cm$^{-3}$ while the carrier concentration in p-type ZnTe can be $10^{19}$ cm$^{-3}$. The discontinuity in valance band along a boundary between p-type ZnSe and p-type ZnTe is about 0.5 eV. If the junction is a step junction, a band bending is produced over the width $$W = (2\epsilon \Phi_T / qN_A)^{1/2} \quad (20)$$

in the valence band of p-type ZnSe along the junction of p-type ZnSe and p-type ZnTe, where q is the absolute value of electron charges, e is the dielectric factor of ZnSe, and $\Phi_T$ is the discontinuous potential (about 0.5 eV) in valence bands along the boundary between p-type ZnSe and p-type ZnTe.

Figure 10:
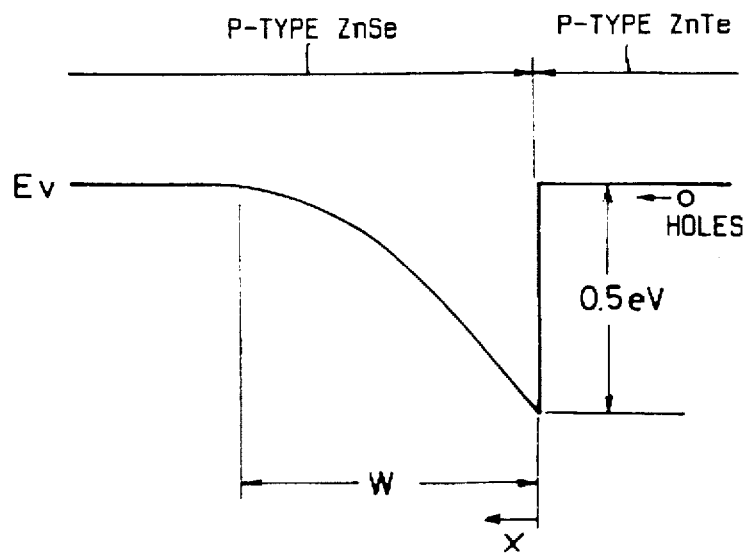
FIG. 10 is an energy band diagram showing valence bands near the boundary between p-type ZnSe and p-type ZnTe.

Calculation of W using equation (20) results in W=32 nm. FIG. 10 shows how the top of the valence bands vary in this case along the direction vertical to the boundary between p-type ZnSe and p-type ZnTe. Fermi levels of p-type ZnSe and p-type ZnTe are approximate when coinciding with tops of the valence bands. As shown in FIG. 10, the valence band of p-type ZnSe bends downward toward p-type ZnTe in this case. Such a downward convex change of the valence band acts as a potential barrier against holes injected from the p-side electrode 11 to the junction of p-type ZnSe and p-type ZnTe.

This problem can be solved by providing the p-type ZnTe/ZnSe MQW layer 15 between the p-type ZnSe contact layer 9 and the p-type ZnTe contact layer 16. The p-type ZnTe/ZnSe MQW layer 15 is specifically designed, for example, as explained below.

Figure 11:
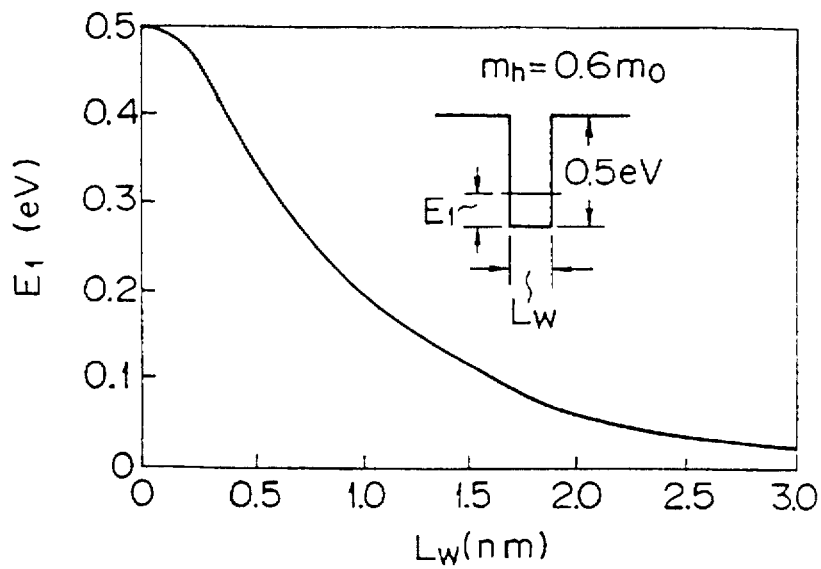
FIG. 11 is a graph showing changes in first quantum level $E_1$ with the width $L_w$ of a p-type ZnTe quantum well.

FIG. 11 shows a result of quantum-mechanical calculation on a well-type potential of a finite barrier to know how the first quantum level $E_1$ varies with respect to the width $L_w$ of a p-type ZnTe quantum well in a single quantum well structure sandwiching the p-type ZnTe quantum well layer by p-type ZnSe barrier layers. In the calculation, assuming the effective mass $m_h$ of holes in p-type ZnSe and p-type ZnTe, 0.6 $m_0$ ($m_0$: free electron mass) was used as the mass of electrons in the quantum well layer and the barrier layers, and 0.5 eV is used as the depth of the well.

It is known from FIG. 11 that the quantum level $E_1$ formed in the quantum well can be elevated by decreasing the width $L_w$ of the quantum well. The p-type ZnTe/ZnSe MQW layer 15 is designed by utilizing this.

In this case, the band bending appearing over the width W in the p-type ZnSe from the boundary between the p-type ZnSe and the p-type ZnTe is given by the following quadratic function of the distance x from the boundary between the p-type ZnSe and the p-type ZnTe (FIG. 10):

$$\Phi(x) = \Phi_T \{ 1 - (x/W)^2 \} \quad (21)$$

Therefore, the p-type ZnTe/ZnSe MQW layer 15 can be designed on the basis of equation (21) by varying $L_w$ such that the quantum levels $E_1$ formed in the respective p-type ZnTe quantum well layers coincide with energies at the tops of the valence bands of the p-type ZnSe and the p-type ZnTe and also coincide with each other.

Figure 12:
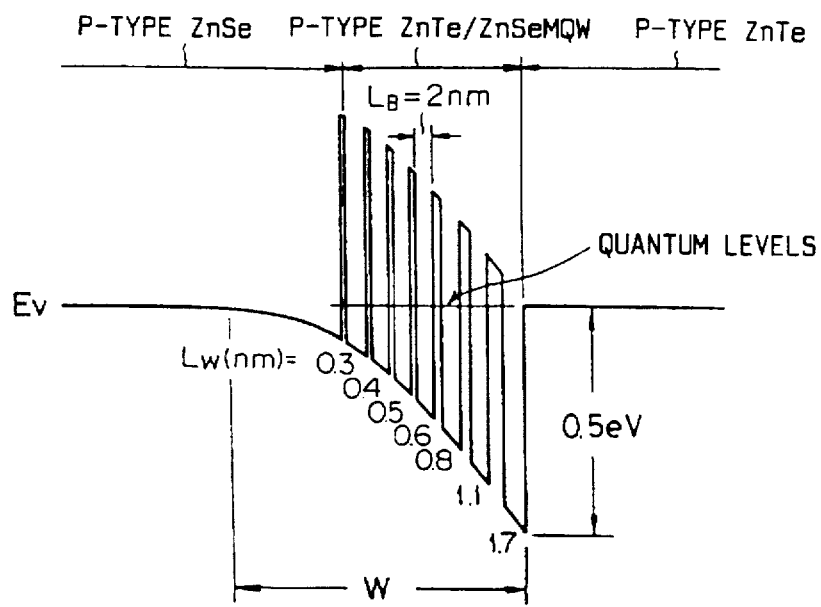
FIG. 12 is an energy band diagram showing a design of a p-type ZnTe/ZnSe MQW layer in the semiconductor laser according to the second embodiment of the invention.

FIG. 12 shows an exemplary design of widths $L_w$ of quantum wells in the p-type ZnTe/ZnSe MQW layer 15 in which the width $L_B$ of each p-type ZnSe barrier layer is 2 nm, the acceptor concentration $N_A$ of the p-type ZnSe contact layer 9 is $5 \times 10^{17}$ cm$^{-3}$, and the acceptor concentration $N_A$ of the p-type ZnTe contact layer 16 is $1 \times 10^{19}$ cm$^{-3}$. As shown in FIG. 12, the exemplary design changes the widths $L_w$ of seven quantum wells from 0.3 nm to 0.4 nm, 0.5 nm, 0.6 nm, 0.8 nm, 1.1 nm and 1.7 nm from the p-type ZnSe contact layer 9 toward the p-type Znte contact layer 16 such that their quantum levels $E_1$ coincide with the Fermi levels of the p-type ZnSe and p-type Znte.

In a strict sense, since levels of the respective quantum wells are bound by each other, their interactions must be taken into consideration, and effects of distortions caused by lattice mismatching between quantum wells and barrier layers must also be incorporated, when designing the widths $L_w$ of the quantum wells. However, It is theoretically possible for quantum levels of the multiquantum well structure to be made flat as shown in FIG. 12.

In FIG. 12, since holes injected to the p-type ZnTe can flow to the p-type ZnSe by resonant tunnelling through the quantum levels $E_1$ formed in the respective quantum wells in the p-type ZnTe/ZnSe MQW layer 15, the potential barrier along the boundary between the p-type ZnSe an d the p-type ZnSe is removed effectively. Therefore, the semiconductor laser according to the second embodiment can realize good voltage-current characteristics and can reduce a great amount of voltage to be applied for oscillation of the laser.

The semiconductor laser according to the second embodiment can be fabricated by the same method as used for fabricating the semiconductor laser according to the first embodiment, which is therefore not explained here.

Values of $\alpha$ and $\beta$ for the semiconductor laser according to the second embodiment become $\alpha=0.059$ and $\beta=0.0042$ when calculated with $I_{th}$=(pulse)=48 mA=0.048 A, $V_{th}$=8 V, $R_S$=12 Ω, $R_T$=23 K/W, and $T_0$~150K. In FIG. 2, (a, β)= (0.059, 0.0042) has been plotted with a black point. It is apparent from FIG. 2 that (0.059, 0.0042) also certainly exists in the area D.

The second embodiment, like the first embodiment, can realize a semiconductor laser capable of emitting green light by continuous oscillation at the room temperature and having the SCH structure with a low threshold current density. This semiconductor laser generates only a small amount of heat during operation, and can be fabricated easily. In particular, with the second embodiment, since the p-type ZnTe/ZnSe MQW layer 15 and the p-type ZnTe contact layer 16 are stacked on the p-type ZnSe contact layer 9 such that the p-side electrode contacts with the p-type ZnTe contact layer 16, generation of heat from the semiconductor laser during its operation can be significantly reduced, and a significant amount of voltage applied for oscillation of the laser can be reduced.

Having described specific embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, the n-type ZnSe optical waveguide layer 4 and the p-type ZnSe optical waveguide layer 6 used in the first and second embodiments may be replaced by i-type ZnSe optical waveguide layers. From the viewpoint of lattice matching, it is desirable to use an n-type ZnS$_u$Se$_{1-u}$ and a p-type ZnS$_u$Se$_{1-u}$ particularly of u=0.06 in lieu of the n-type ZnSe optical waveguide layer 4 and the p-type ZnSe optical waveguide layer 6.

Although the first and second embodiments irradiate $N_2$ plasma generated by ECR for doping N as a p-type impurity into the p-type ZnSe optical waveguide layer 6, p-type $Zn_{1-p}Mg_pS_qSe_{1-q}$ cladding layer 7, p-type $ZnS_vSe_{1-v}$ layer 8, p-type ZnSe contact layer 9, and p-type ZnTe contact layer 16, doping of N may be done, for example, by irradiating $N_2$ excited by a high frequency plasma.

Further, the GaAs substrate used in the first and second embodiments as a compound semiconductor substrate may replaced with, for example, a GaP substrate.

Although the first and second embodiments have been described as applying the invention to semiconductor lasers having an SCH structure, the invention may be applied to a semiconductor laser having a DH (double heterostructure) structure.

The same technical concept as the present invention can also be applied to semiconductor lasers using III-V compound semiconductors. For example, it may be applied to semiconductor lasers using a GaN compound semiconductor as the material of the active layer and using an AlGaN compound semiconductor as the material of the cladding layers, and capable of emitting blue light, or may be applied to semiconductor lasers using an AlGaInP compound semiconductor as the material of the active layer and using an AlGaInP compound semiconductor having a larger band gap than the AlGaInP compound semiconductor of the active layer as the material of the cladding layer, and capable of emitting green to yellow-green light.

Further, the same technical concept can also be applied to semiconductor lasers using chalcopyrite semiconductors. Chalcopyrite semiconductors usable are, for example, those of a first kind including a group I element, a group III element and a group VI element in the ratio of atoms of 1:1:2, specifically such as $CuInSe_2$, $CuGaSe_2$, $CuAlSe_2$, or the like; those of a second kind including a group II element, a group IV element and a group V element in the ratio of atoms of 1:1:2, specifically such as $ZnSiP_2$, $ZnSiAs_2$, $ZnGeP_2$, $ZnGeAs_2$, $ZnSnP_2$, $ZnSnAs_2$, $CdSiP_2$, $CdSiAs_2$, $CdGeP_2$, $CdGeAs_2$, $CdSnP_2$, $CdSnAs_2$, or the like; and those of a third kind including a group II element, a group III element and a group VI element in the ratio of atoms of 1:2:4, specifically such as $ZnGa_2S_4$, $ZnIn_2S_4$, $CdGa_2S_4$, $CdIn_2S_4$, or the like.

As described above, the invention can realize a semiconductor laser using a II-VI compound semiconductor as the material of its cladding layers and having the capability of continuous oscillation at high temperatures including the room temperature.

What is claimed is:

1. A method of generating laser radiation comprising the steps of:

providing a semiconductor laser structure comprising a first cladding layer of a first conduction type;

an active layer stacked on said first cladding layer; and a second cladding layer of a second conduction type stacked on said active layer, wherein said first cladding layer, said active layer and said second cladding layer are comprised of II-VI compound semiconductors; and continuously oscillating said semiconductor laser structure at room temperature with characteristics of a threshold current $I_{th}(A)$, a threshold voltage $V_{th}(V)$ of a diode composed of said first cladding layer, said active layer and said second cladding layer, a differential resistance $R_S(\Omega)$ of said diode, a thermal resistance $R_t(K/W)$ and a characteristic temperature $T_0(K)$, wherein when $\alpha$ and $\beta$ are defined as:

$$\alpha \equiv (R_t/T_0)I_{th}V_{th}$$

$$\beta \equiv (R_t/T_0)R_S I_{th}^2$$

such that the point $\alpha$, $\beta$ exists in an area on the $\alpha$-$\beta$ plane surrounded by the straight line $\alpha=0$, and the curve $((2\ln t-1)/(1-\ln t)/t^2)$ where t is a parameter.

2. The method of generating laser radiation of claim 1, wherein said step of providing a semiconductor laser structure comprise a step of:

providing a first optical wave guide layer between said first cladding layer and said active layer and including a second optical wave guide layer between said second cladding layer and said active layer, said first optical wave guide layer and said second optical wave guide layer being made of a II-VI compound semiconductor.

3. The method of generating laser radiation of claim 4, wherein said II-VI compound semiconductor forming said first cladding layer and said second cladding layer is a ZnMgSSe compound semiconductor.

* * * * *

UNITED STATES PATENT AND TRADEMARK OFFICE
CERTIFICATE OF CORRECTION

PATENT NO. : 5,764,672
DATED : June 9, 1998
INVENTOR(S) : Masakazu Ukita; Akira Ishibashi It is certified that error appears in the above-indentified patent and that said Letters Patent is hereby corrected as shown below:

Column 4, line 46, change "a" to --$\alpha$--

Column 10, line 21, change "$2\mu m$" to --$2\mu s$--

Column 10, line 36, change "$I_{th}$=(pulse)" to --$I_{th}$(pulse)--

Column 14, line 31, change "$I_{th}$=(pulse)" to --$I_{th}$(pulse)--

Column 16, line 29, after "$\alpha=0$," insert --the straight line $\beta=0$,--

Column 16, line 30, change "$((2\ln t-1) / (1-\ln t) / t^2)$" to --$((2\ln t-1) / t, (1-\ln t) / t^2)$--

Signed and Sealed this

Twenty-eighth Day of September, 1999

*Attest:*

Q. TODD DICKINSON

*Attesting Officer*     *Acting Commissioner of Patents and Trademarks*